United States Patent [19]

Schmeckenbecher

[11] 3,948,706

[45] Apr. 6, 1976

[54] METHOD FOR METALLIZING CERAMIC GREEN SHEETS

[75] Inventor: Arnold Friedrich Schmeckenbecher, Poughkeepsie, N.Y.

[73] Assignee: International Business Machines Corporation, Armonk, N.Y.

[22] Filed: Dec. 13, 1973

[21] Appl. No.: 424,505

[52] U.S. Cl. .................. 156/89; 29/424; 29/625; 156/155; 264/61; 264/104; 427/97; 427/272; 427/226; 427/282; 427/259; 427/287
[51] Int. Cl.$^2$.................................. C04B 39/00
[58] Field of Search ............ 156/309, 247, 89, 278, 156/182, 281, 155, 344, 246, 253, 250, 293; 29/472.9, 625, 530, 527.2; 339/17 B; 161/DIG. 7; 117/212, 8.5, 213, 123 B, 8, 38, 161 P, 5.5, 35.5; 264/56, 61, 58, 63, 59, 67, DIG. 36, 104; 101/128.2; 427/97, 272, 226, 282, 259, 287; 25/423, 424

[56] References Cited
UNITED STATES PATENTS

| | | | |
|---|---|---|---|
| 2,139,640 | 12/1938 | Mall et al. ......................... | 117/5.5 |
| 2,993,815 | 7/1961 | Treptow ............................ | 156/89 |
| 3,293,072 | 12/1966 | Doolittle et al. .................. | 156/89 |
| 3,502,491 | 3/1970 | Orth.................................. | 117/5.5 |
| 3,518,756 | 7/1970 | Bennett et al. ................... | 156/89 |
| 3,615,980 | 10/1971 | Schuck et al. .................... | 156/89 |
| 3,632,365 | 1/1972 | Gray................................. | 117/161 P |
| 3,770,529 | 11/1973 | Anderson.......................... | 156/89 |

FOREIGN PATENTS OR APPLICATIONS 966,945  8/1964  United Kingdom.................. 264/63

OTHER PUBLICATIONS

Chance et al., "Obtaining Thick Metal Planes in Sintered Ceramics," (IBM Tech. Pub.), Vol. 10, No. 11, 4–1968.

*Primary Examiner*—Douglas J. Drummond
*Assistant Examiner*—J. J. Gallagher
*Attorney, Agent, or Firm*—George O. Saile

[57] ABSTRACT

A process for metallizing a ceramic green sheet having via holes or recessed grooves formed therein by depositing a mask forming material over the green sheet, the mask forming material being non-wettable by a composition, either conductive or nonconductive, to be subsequently deposited in the via holes or recessed grooves. After the depositing step, a metal paste is spread or wiped into the vias and grooves and then the sheets are laminated and fired to form a multi-layer ceramic interconnection package whereby the mask forming material is volatized and eliminated from the structure without the necessity of removing the mask forming material in the conventional etching or peeling away methods.

7 Claims, 1 Drawing Figure

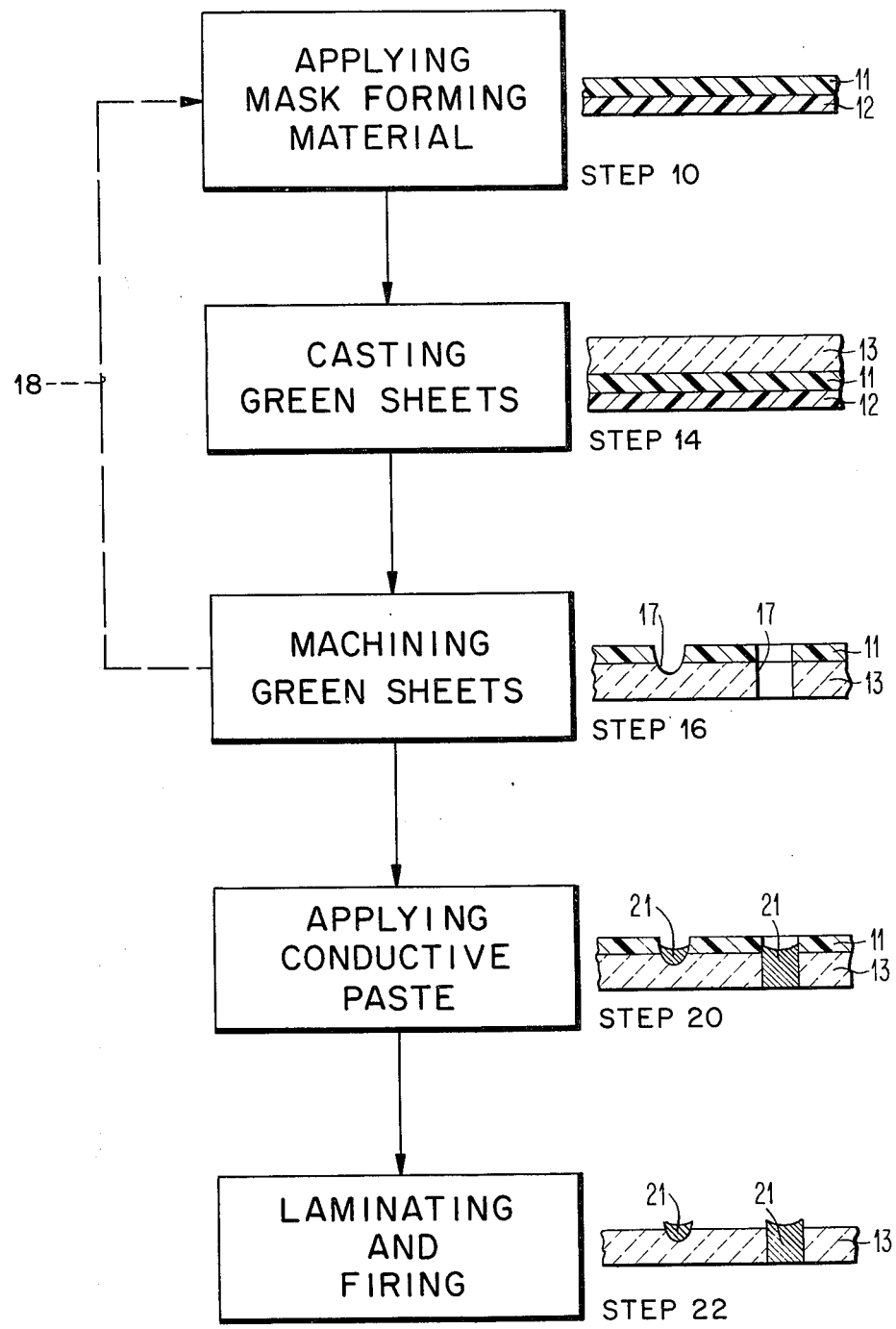

METHOD FOR METALLIZING CERAMIC GREEN SHEETS

BACKGROUND OF THE INVENTION

In the prior art, it has been suggested to use a metal mask in order to metallize a ceramic green sheet material. A considered improvement over the metal mask technique is the process of laminating an organic material to ceramic green sheet surface and then defining predetermined patterns or openings through the organic material into the green sheet. The resulting channels and via holes are filled with a metal paste and then the organic mask is removed by peeling subsequent to the metal paste deposition step. This last approach is disclosed in U.S. patent application Ser. No. 371,925, filed June 20, 1973, now abandoned and assigned to the same assignee of the present invention.

However, in the last mentioned approach two characteristics of that process are sometimes undesirable. Namely, in the peelable mask approach, the mask must be physically removed from the green sheet prior to laminating and firing. This required step often becomes extremely difficult when certain configurations are formed in the mask. For example, when a circle or small annular opening is circumscribed in the mask material peeling of the contiguous portion of the mask leaves the small mask island still remaining on the green sheet. With extremely high density patterns, the additional step of removing the small island mask is a tedious and time consuming process, particularly when it may occur in numerous locations.

SUMMARY OF THE INVENTION

It is therefore an object of the present invention to provide a method for forming a metallized interconnection pattern for a ceramic green sheet which gives improved line definition.

Another object of the present invention is to provide a recessed metallized interconnection pattern for a ceramic green sheet material of improved quality which is advantageously suitable for fabricating multilayer ceramic and/or single level connection packages wherein integrated circuit chips connected to the surface of each package.

A further object of the present invention is to provide an interconnection metallizing method for ceramic green sheet material which avoids chemical etching and thus improves the quality by avoiding contamination problems.

Another object of the present invention is to provide a recessed metallization process for a ceramic green sheet material which eliminates the need for mask registration in the formation of complex and high resolution metallized lines.

A further object of the present invention is to provide a metallization scheme for green ceramic sheet material which is highly accurate for high quality fine line deposition and which is compatible to thermal machining by energy such as laser or electron sources.

Another object of the present invention is to provide a metallization scheme for green ceramic material which is advantageously adaptable to dry or wet metal deposition techniques.

Another object of the present invention is to provide a process for metallizing via holes and recessed grooves in a ceramic green sheet material which does not require mask removal subsequent to metal deposition or prior to laminating and firing.

A further object of the present invention is to provide a method for metallizing ceramic green sheet material which not only eliminates the need for mask removal during the metallization of a single layer of material, but also assists in securing high quality structures during the laminating process thereafter.

In accordance with aforementioned objects, the present invention provides a method for metallizing recessed grooves and via holes in a ceramic green sheet and thereafter laminating the same when forming multi-layer ceramic packages by spreading or depositing a mask forming material which is non-wettable to the metal to be subsequently deposited, and which is volatizable during a subsequent heating step so as to eliminate the necessity of removing the mask by etching, peeling, etc. Additionally, the mask forming material possesses thermal plastic characteristics which aids in the lamination of a plurality of metal filled green sheets at a temperature lower than the volatizing temperature.

BRIEF DESCRIPTION OF THE DRAWING

The sole FIGURE illustrates the basic process steps of the present invention.

DETAILED DESCRIPTION OF THE INVENTION

Now referring to the process steps illustrated in the sole FIGURE, at Step 10 a mask forming material 11 is applied to a suitable backing material 12 such as polyethylene terephthalate polyester, by suitable means such as dipping, spraying, or rolling. In the preferred embodiment, the mask forming material 11 is constituted by a polyvinyl alcohol or a polyamide composition.

Thereafter, at Step 14, a ceramic slurry 13 formed by any conventional desired manner is cast over the mask forming material 11 which at this time is in an adhering relation with the polyester organic backing material 12. The composition and preparation of slurry 13 for the preferred embodiment is disclosed, for example, in the article "A Fabrication Technique For Multi-Layer Ceramic Modules", H. D. Kaiser et al., Solid State Technology, May 1972, pp. 35–40. However, other ceramic compositions are suitable for implementation within the spirit of the present disclosure as long as the other constraints of the present invention are maintained. After the ceramic slurry is dried, the organic polyester 12 is removed so as to leave the mask forming material 11, again either a polyvinyl alcohol or a polyamide layer adhering to the cast and dried ceramic green sheet material 13.

At Step 16, the ceramic green sheet material is machined by any suitable process. In the preferred embodiment E-beam or laser thermal machining is preferred to form the via holes 15 and recessed metallized channels 17 through the mask material 11.

Alternatively, the mask forming material such as polyvinylalcohol or polyamide, can be directly applied to an already fabricated ceramic green sheet material as indicated by dotted line 18. In this alternative process, the thermal machining would occur after the direct application of the mask forming material to the green sheet and would not require application of the mask forming material to the organic polyethylene sheet and subsequent removal prior to machining. Also, other means of machining the green sheets to form the via holes and recessed lines therein, such as, stamping or cutting are equally suitable for certain applications.

Thereafter, at Step 20 a conductive metal paste 21 is applied to the via holes and recessed grooves by such means as extrusion heads, rolling, wiping, etc. In the preferred embodiment a conductive paste having vehicles therein is employed and the only constraint is that the vehicles be non-solvent to the mask material 11 which is defining the via holes and recessed grooves. Liquid or powder conductive paste can also be used for certain applications and need not be limited to a conductive paste type of material.

With the particular ceramic slurry and binder system employed in the preferred embodiment the polyvinyl alcohol or the polyamide mask forming material is most desirous. The important characteristics of the mask forming material are that (1) it be non-wettable to the type of conductive paste being employed at Step 20 and (2) it be volatizable during a subsequent heating step. Additionally, the mask forming material should possess most desirably, although not as critical as the two prior requirements, some degree of thermal plasticity, particularly where the conductive green sheet layers are to be laminated and employed to form a multi-layer ceramic package.

For example, at Step 22, when the metal filled individual ceramic green sheets are laminated and then heated towards a sintering or firing temperature, the polyvinyl alcohol or polyamide material reaches a thermoplastic state prior to the volatilization state and aids in the bonding of the plurality of sheets together in a unified body. Thereafter as the temperature continues to increase, the mask forming material 11 volatilizes at a higher temperature and is thus eliminated or removed from the multi-layer structure without the necessity of any prior peeling or actual physical removal steps, and accordingly does not interfere with the characteristics of the package from an electrical or physical standpoint. At Step 22, the structure is shown after heating and volatization for only a single sheet, but volatization, of course, also occurs for a plurality of stacked sheets.

In the preferred embodiment, a molybdenum paste is employed. However, for certain applications it may be desired to selectively deposit non-conductive materials in the same manner in which the metallized patterns of the present invention are deposited.

Of course it is important that the mask forming materials be non-soluble in the metal composition, vehicles so as not to damage the predefined patterns which is inherent by the term non-wettable. Thus polyvinyl chloride and many others are also mask material alternatives within the constraints defined above. For multilayer package application, the high temperature ceramic green sheet material used in the present invention assist in laminating as the material 11 reaches a thermal plastic state at a temperature around 80°C, and then volatizes at a temperature range around 400°–500°C, and finally the green sheets sinter at a 1500°–1600°C range.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. A process for making a multilayer ceramic electrical interconnection structure comprising:
   providing a thermoplastic sheet on a ceramic green sheet;
   forming openings in the said thermoplastic sheet in a desired pattern;
   applying a conductive metal paste to the said thermoplastic sheet to fill the said openings and to thereby form a metallized composite structure;
   laminating the said composite structure with at least one other similar metallized composite structure; and
   firing the laminated structure by heating from room temperature to the temperature of volatilization of the thermoplastic sheet and then to the sintering temperature of the ceramic green sheet to produce said multilayer ceramic structure.

2. The process of claim 1 wherein said thermoplastic material is a polyvinyl alcohol, a polyvinyl chloride, a polyamide, or combinations thereof.

3. The process of claim 1 wherein the said metal paste includes molybdenum.

4. A process for metallizing a ceramic green sheet compising the steps of:
   a. depositing a thermoplastic material over a ceramic green sheet, the material being non-wettable by a conductive metal composition to be subsequently used for forming patterns on the ceramic green sheet, and being also volatizable at a predetermined temperature,
   b. forming grooves or via holes in the green sheet through the non-wettable material,
   c. depositing said composition over the ceramic green sheet surface so as to deposit said composition in grooves or via holes not covered by the non-wettable material, and
   d. heating the ceramic green sheet material so as to volatize and eliminate said non-wettable material.

5. A process for metallizing a ceramic green sheet as in claim 1 further including the step of:
   a. selecting a metal composition for said conductive composition having vehicles therein so as to constitute a metal paste, and further selecting the non-wettable material to be non-soluble in said vehicles.

6. A process for metallizing a ceramic green sheet as in claim 1 wherein:
   a. said non-wettable material comprises a polyvinyl alcohol.

7. A process for metallizing a ceramic green sheet as in claim 1 wherein:
   a. said non-wettable material comprises a polyamide material.

* * * * *